US010211183B2

(12) United States Patent
Lin et al.

(10) Patent No.: US 10,211,183 B2
(45) Date of Patent: Feb. 19, 2019

(54) SEMICONDUCTOR DEVICE AND METHOD OF FORMING SHIELDING LAYER OVER INTEGRATED PASSIVE DEVICE USING CONDUCTIVE CHANNELS

(71) Applicant: STATS ChipPAC, Ltd., Singapore (SG)

(72) Inventors: Yaojian Lin, Singapore (SG); Jianmin Fang, Singapore (SG); Kang Chen, Singapore (SG); Haijing Cao, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 97 days.

(21) Appl. No.: 15/069,719

(22) Filed: Mar. 14, 2016

(65) Prior Publication Data

US 2016/0197059 A1    Jul. 7, 2016

Related U.S. Application Data

(63) Continuation of application No. 12/205,727, filed on Sep. 5, 2008, now Pat. No. 9,324,700.

(51) Int. Cl.
*H01L 29/00* (2006.01)
*H01L 25/065* (2006.01)
(Continued)

(52) U.S. Cl.
CPC .......... *H01L 25/0657* (2013.01); *H01L 25/50* (2013.01); *H01L 27/016* (2013.01);
(Continued)

(58) Field of Classification Search
CPC .. H01L 23/5221–23/5228; H01L 2225/06537; H01L 2924/3025; H01L 23/645; H01L 28/10; H01L 2223/6655
See application file for complete search history.

(56) References Cited

U.S. PATENT DOCUMENTS 5,477,204 A    12/1995  Li
6,218,729 B1    4/2001  Zavrel, Jr. et al.
(Continued)

FOREIGN PATENT DOCUMENTS

JP           02072660          3/1990

*Primary Examiner* — Cuong B Nguyen
(74) *Attorney, Agent, or Firm* — Brian M. Kaufman; Robert D. Atkins; Patent Law Group: Atkins and Associates, P.C.

(57) ABSTRACT

A semiconductor device is made by providing a substrate, forming a first insulation layer over the substrate, forming a first conductive layer over the first insulation layer, forming a second insulation layer over the first conductive layer, and forming a second conductive layer over the second insulation layer. A portion of the second insulation layer, first conductive layer, and second conductive layer form an integrated passive device (IPD). The IPD can be an inductor, capacitor, or resistor. A plurality of conductive pillars is formed over the second conductive layer. One conductive pillar removes heat from the semiconductor device. A third insulation layer is formed over the IPD and around the plurality of conductive pillars. A shield layer is formed over the IPD, third insulation layer, and conductive pillars. The shield layer is electrically connected to the conductive pillars to shield the IPD from electromagnetic interference.

21 Claims, 10 Drawing Sheets

(51) Int. Cl.
*H01L 27/01* (2006.01)
*H01L 25/00* (2006.01)
*H01L 23/552* (2006.01)
*H01L 27/07* (2006.01)

(52) U.S. Cl.
CPC ......... *H01L 23/552* (2013.01); *H01L 27/0711* (2013.01); *H01L 2224/0554* (2013.01); *H01L 2224/0557* (2013.01); *H01L 2224/05568* (2013.01); *H01L 2224/05571* (2013.01); *H01L 2224/05573* (2013.01); *H01L 2224/05611* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/16225* (2013.01); *H01L 2225/06531* (2013.01); *H01L 2225/06537* (2013.01); *H01L 2225/06582* (2013.01); *H01L 2225/06593* (2013.01); *H01L 2924/00014* (2013.01); *H01L 2924/13091* (2013.01); *H01L 2924/15311* (2013.01); *H01L 2924/19011* (2013.01)

(56) References Cited

U.S. PATENT DOCUMENTS

| | | | |
|---|---|---|---|
| 7,199,679 B2 | 4/2007 | Mondal | |
| 2001/0028098 A1 | 10/2001 | Liou | |
| 2002/0064922 A1* | 5/2002 | Lin | H01L 21/768 438/381 |
| 2002/0158306 A1 | 10/2002 | Niitsu | |
| 2004/0077124 A1 | 4/2004 | Ogawa | |
| 2004/0222506 A1* | 11/2004 | Wei | H01L 23/552 257/686 |
| 2004/0245580 A1 | 12/2004 | Lin | |
| 2005/0037611 A1 | 2/2005 | Pon | |
| 2007/0114634 A1 | 5/2007 | Lin et al. | |
| 2007/0148981 A1* | 6/2007 | Rogge | G06K 19/07745 438/700 |
| 2007/0217174 A1 | 9/2007 | Shen | |
| 2008/0012097 A1 | 1/2008 | Takahashi et al. | |
| 2008/0238599 A1* | 10/2008 | Hebert | H01L 23/645 336/110 |
| 2009/0236734 A1 | 9/2009 | Lee et al. | |
| 2010/0295649 A1 | 11/2010 | Gardner | |

* cited by examiner

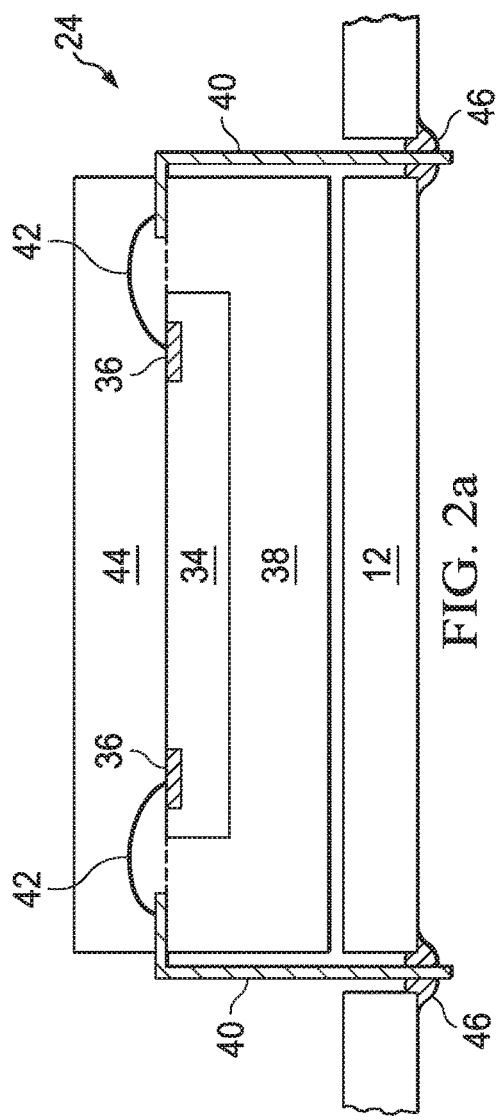
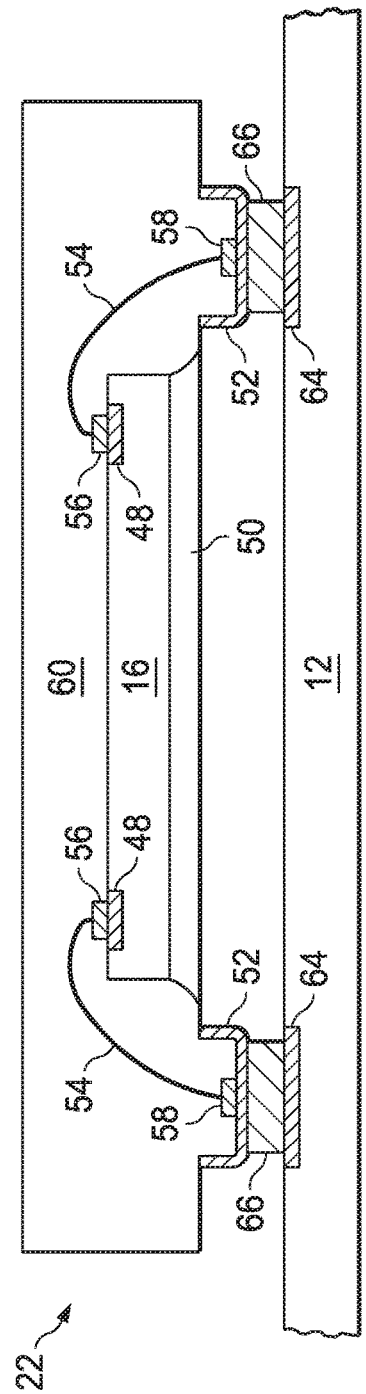

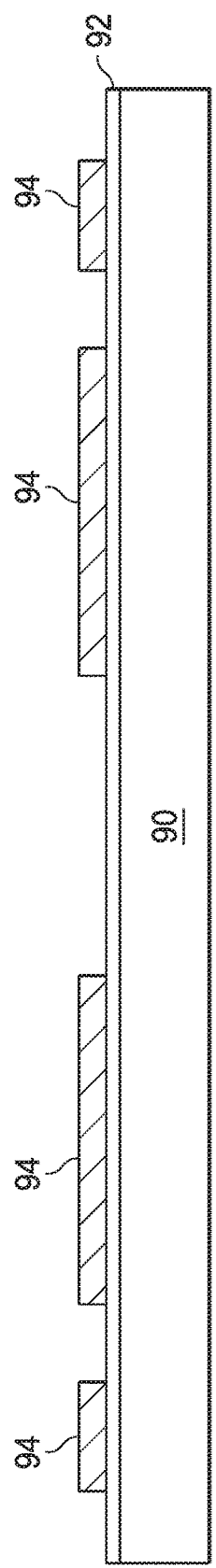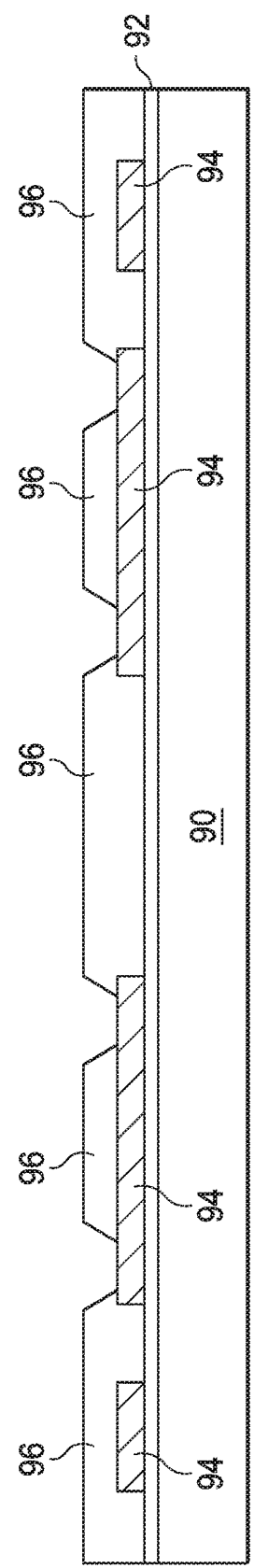

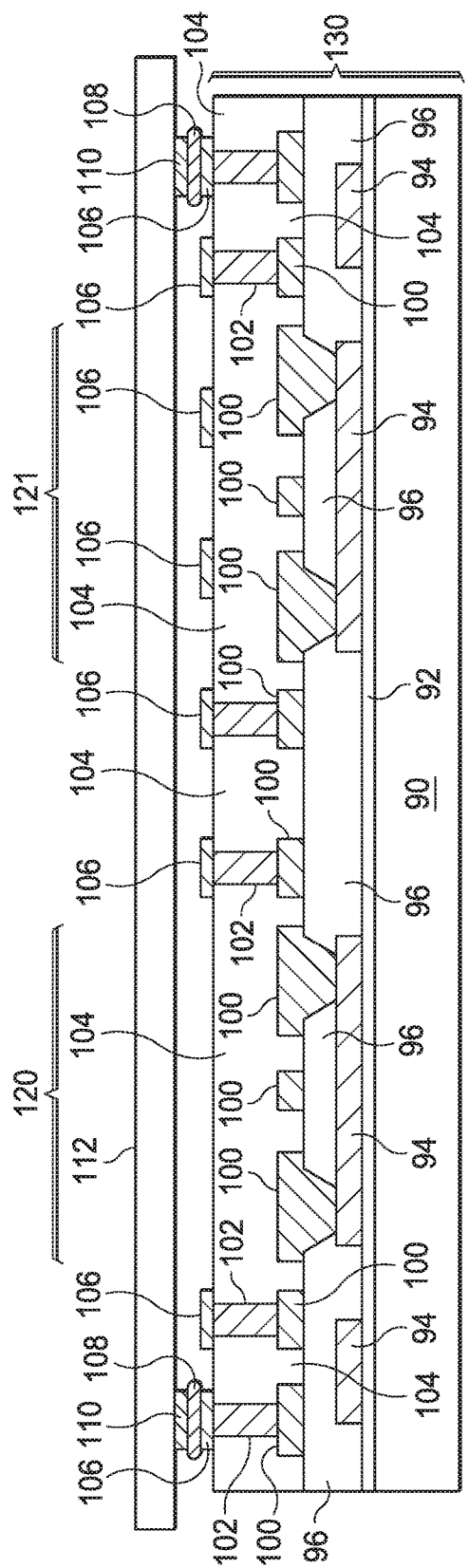
FIG. 3g
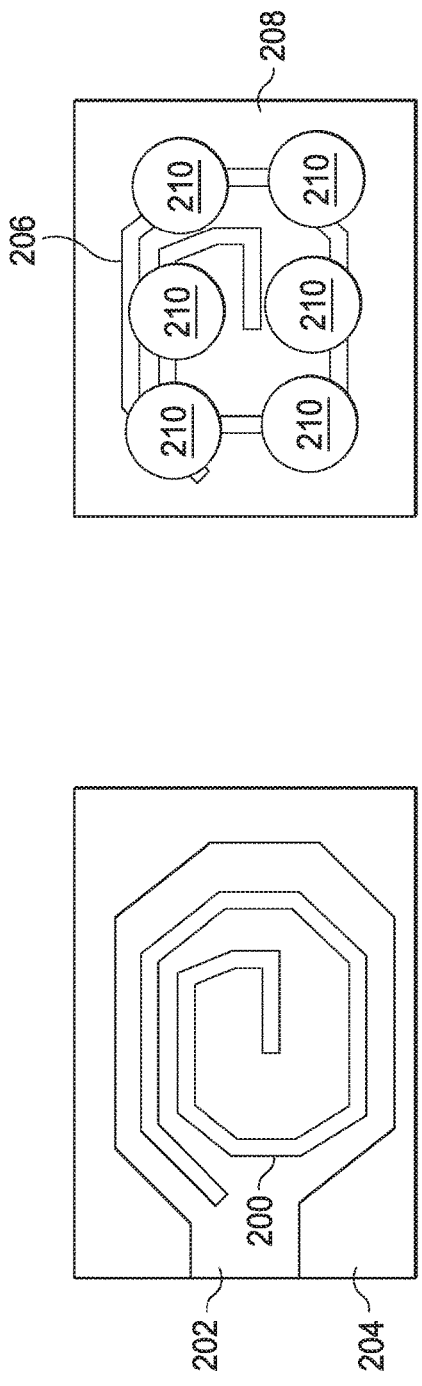
FIG. 4a
FIG. 4b

SEMICONDUCTOR DEVICE AND METHOD OF FORMING SHIELDING LAYER OVER INTEGRATED PASSIVE DEVICE USING CONDUCTIVE CHANNELS

CLAIM TO DOMESTIC PRIORITY

The present application is a continuation of U.S. patent application Ser. No. 12/205,727, now U.S. Patent No. 9,324,700, filed Sep. 5, 2008, which application is incorporated herein by reference.

FIELD OF THE INVENTION

The present invention relates in general to semiconductor devices and, more particularly, to a semiconductor device having integrated passive devices (IPD) with enhanced thermal characteristics and protection against electromagnetic interference.

BACKGROUND OF THE INVENTION

Semiconductor devices are ubiquitous in modern electronic products. Semiconductor devices vary in the number and density of electrical components. Discrete semiconductor devices generally contain one type of electrical component, e.g., light emitting diode (LED), transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power generation, networks, computers, and consumer products. Semiconductor devices are also found in electronic products including military, aviation, automotive, industrial controllers, and office equipment.

Semiconductor devices exploit the electrical properties of semiconductor materials. The atomic structure of semiconductor material allows its electrical conductivity to be manipulated by the application of an electric field or through the process of doping. Doping introduces impurities into the semiconductor material.

A semiconductor device contains active and passive electrical structures. Active structures, including transistors, control the flow of electrical current. By varying levels of doping and application of an electric field, the transistor either promotes or restricts the flow of electrical current. Passive structures, including resistors, diodes, and inductors, create a relationship between voltage and current necessary to perform a variety of electrical functions. The passive and active structures are electrically connected to form logic circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, can be produced more efficiently, and have higher performance. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

Another goal of semiconductor manufacturing is to produce higher performance semiconductor devices. Increases in device performance can be accomplished by forming active components that are capable of operating at higher speeds. In high frequency applications, such as radio frequency (RF) wireless communications, integrated passive devices (IPDs) are often contained within the semiconductor device. Examples of IPDs include resistors, capacitors, and inductors. A typical RF system requires multiple IPDs in one or more semiconductor packages to perform the necessary electrical functions. However, high frequency electrical devices generate or are susceptible to undesired electromagnetic interference (EMI) and radio frequency interference (RFI), or other inter-device interference, such as capacitive, inductive, or conductive coupling, also known as cross-talk.

Another goal of semiconductor manufacturing is to produce semiconductor devices with adequate heat dissipation. High frequency semiconductor devices generally generate more heat. Without effective heat dissipation, the generated heat can reduce performance, decrease reliability, and reduce the useful lifetime of the semiconductor device.

SUMMARY OF THE INVENTION

A need exists to shield IPDs from EMI, RFI, and other externally generated interference. Accordingly, in one embodiment, the present invention is a method of making a semiconductor device comprising the steps of providing a first substrate, forming a first conductive layer over the first substrate, forming an integrated passive device (IPD) over the first conductive layer, forming a first conductive pillar over the first conductive layer, and forming a second conductive layer over the first conductive pillar to shield the IPD from electromagnetic interference (EMI). The second conductive layer is electrically coupled to the first conductive layer through the first conductive pillar.

In another embodiment, the present invention is a method of making a semiconductor device comprising the steps of providing a first substrate, forming a first conductive layer over the first substrate including a first portion of the first conductive layer coiled to exhibit inductive properties, forming a first conductive pillar over the first conductive layer, and forming a second conductive layer over the first conductive pillar.

In another embodiment, the present invention is a method of making a semiconductor device comprising the steps of providing a first substrate, forming an IPD over the first substrate, forming a first conductive pillar over the substrate, and forming a first conductive layer over the first conductive pillar and IPD.

In another embodiment, the present invention is a semiconductor device comprising a first substrate and a first conductive layer formed over the first substrate. An IPD is formed to include a portion of the first conductive layer. A first conductive pillar is formed over the first conductive layer. A second conductive layer is formed over the first conductive pillar.

BRIEF DESCRIPTION OF THE DRAWINGS

FIGS. 2a-2c illustrate further detail of representative semiconductor packages mounted to the PCB;

FIGS. 3a-3g illustrate a process of constructing an IPD protected by an embedded EMI shielding structure with enhanced thermal characteristics;

FIG. 4a-4b illustrate representative top views of an IPD protected by an embedded EMI shielding structure with enhanced thermal characteristics;

DETAILED DESCRIPTION OF THE DRAWINGS

Figure 1:
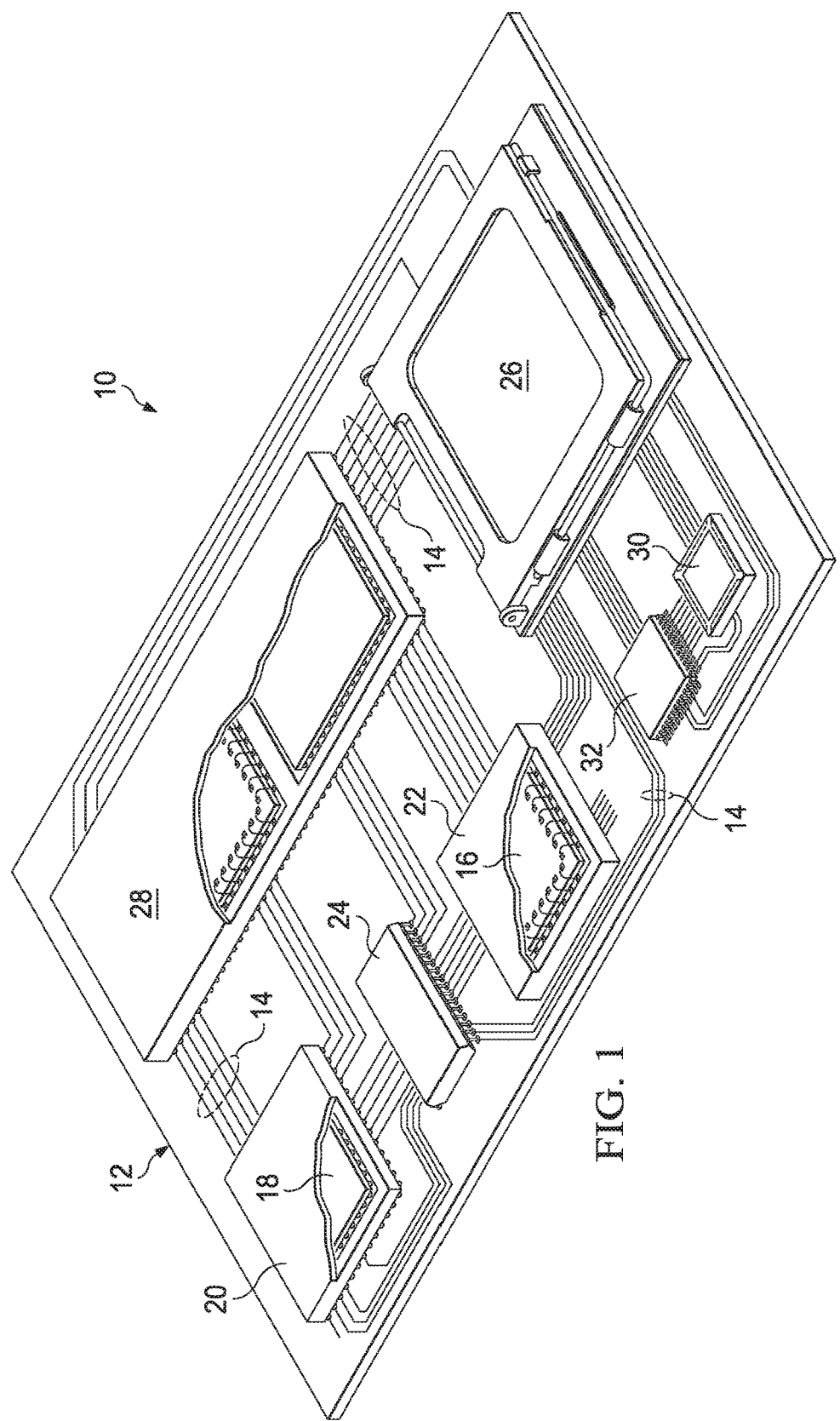
FIG. 1 illustrates a printed circuit board (PCB) with different types of packages mounted to its surface.

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components which are electrically connected to form circuits. Active electrical components, such as transistors, have the ability to control the flow of electrical current. Passive electrical components, such as capacitors, inductors, resistors, and transformers, create a relationship between voltage and current necessary to perform electrical circuit functions.

Passive and active components are formed on the surface of the semiconductor wafer by a series of process steps including doping, thin film deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into a permanent insulator, permanent conductor, or changing the way the semiconductor material changes in conductivity in response to an electric field. Transistors contain regions of varying types and degrees of doping arranged as necessary to enable the transistor to promote or restrict the flow of electrical current upon the application of an electric field.

Active and passive components are formed by layers of materials with different electrical properties. The layers can be formed by thin film deposition. The type of material being deposited determines the thin film deposition technique. The thin film deposition techniques include chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Some types of materials are patterned without being etched; instead patterns are formed by directly depositing the material into the areas or voids formed by a previous deposition/etch process using techniques such as electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical remove any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. In some cases, the wafer is singulated using a laser cutting device or saw blade. After singulation, the individual die are mounted to a package substrate which includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 10 having a chip carrier substrate or printed circuit board (PCB) 12 with a plurality of semiconductor packages mounted on its surface. Electronic device 10 may have one type of semiconductor package, or multiple types of semiconductor packages, depending on the application. The different types of semiconductor packages are shown in FIG. 1 for purposes of illustration.

Electronic device 10 may be a stand-alone system that uses the semiconductor packages to perform an electrical function. Alternatively, electronic device 10 may be a subcomponent of a larger system. For example, electronic device 10 may be a graphics card, network interface card, or other signal processing card that can be inserted into a computer. The semiconductor package can include microprocessors, memories, application specific integrated circuits (ASICs), logic circuits, analog circuits, RF circuits, discrete devices, or other semiconductor die or electrical components.

In FIG. 1, PCB 12 provides a general substrate for structural support and electrical interconnect of the semiconductor packages mounted on the PCB. Conductive signal traces 14 are formed on a surface or within layers of PCB 12 using evaporation, electrolytic plating, electroless plating, screen printing, or other suitable metal deposition process. Signal traces 14 provide for electrical communication between each of the semiconductor packages, mounted components, and other external system components. Traces 14 also provide power and ground connections to each of the semiconductor packages.

In some embodiments, a semiconductor device has two packaging levels. First level packaging is the technique for mechanically and electrically attaching the semiconductor die to a carrier. Second level packaging involves mechanically and electrically attaching the carrier to the PCB. In other embodiments, a semiconductor device may only have the first level packaging where the die is mechanically and electrically attached directly to the PCB.

For the purpose of illustration, several types of first level packaging, including wire bond package 16 and flip chip 18, are shown on PCB 12. Additionally, several types of second level packaging, including ball grid array (BGA) 20, bump chip carrier (BCC) 22, dual in-line package (DIP) 24, land grid array (LGA) 26, multi-chip module (MCM) 28, quad flat non-leaded package (QFN) 30, and quad flat package 32, are shown mounted on PCB 12. Depending upon the system requirements, any combination of semiconductor packages, configured with any combination of first and second level packaging styles, as well as other electronic components, can be connected to PCB 12. In some embodiments, electronic device 10 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a shorter manufacturing process. The resulting devices are less likely to fail and less expensive to manufacture resulting in lower costs for consumers.

FIG. 2a illustrates further detail of DIP 24 mounted on PCB 12. DIP 24 includes semiconductor die 34 having contact pads 36. Semiconductor die 34 includes an active area containing analog or digital circuits implemented as active devices, passive devices, conductive layers, and dielectric layers formed within semiconductor die 34 and are electrically interconnected according to the electrical design of the die. For example, the circuit may include one or more transistors, diodes, inductors, capacitors, resistors, and other circuit elements formed within the active area of die 34. Contact pads 36 are made with a conductive material, such as aluminum (Al), copper (Cu), tin (Sn), nickel (Ni), gold (Au), or silver (Ag), and are electrically connected to the circuit elements formed within die 34. Contact pads 36 are formed by PVD, CVD, electrolytic plating, or electroless plating process. During assembly of DIP 24, semiconductor die 34 is mounted to a carrier 38 using a gold-silicon eutectic layer or adhesive material such as thermal epoxy. The package body includes an insulative packaging material such as plastic or ceramic. Conductor leads 40 are connected to carrier 38 and wire bonds 42 are formed between leads 40 and contact pads 36 of die 34 as a first level packaging. Encapsulant 44 is deposited over the package for environmental protection by preventing moisture and particles from entering the package and contaminating die 34, contact pads 36, or wire bonds 42. DIP 24 is connected to PCB 12 by inserting leads 40 into holes formed through PCB 12. Solder material 46 is flowed around leads 40 and into the holes to physically and electrically connect DIP 24 to PCB 12. Solder material 46 can be any metal or electrically conductive material, e.g., Sn, lead (Pb), Au, Ag, Cu, zinc (Zn), bismuthinite (Bi), and alloys thereof, with an optional flux material. For example, the solder material can be eutectic Sn/Pb, high-lead, or lead-free.

FIG. 2b illustrates further detail of BCC 22 mounted on PCB 12. Semiconductor die 16 is connected to a carrier by wire bond style first level packaging. BCC 22 is mounted to PCB 12 with a BCC style second level packaging. Semiconductor die 16 having contact pads 48 is mounted over a carrier using an underfill or epoxy-resin adhesive material 50. Semiconductor die 16 includes an active area containing analog or digital circuits implemented as active devices, passive devices, conductive layers, and dielectric layers formed within semiconductor die 16 and are electrically interconnected according to the electrical design of the die. For example, the circuit may include one or more transistors, diodes, inductors, capacitors, resistors, and other circuit elements formed within the active area of die 16. Contact pads 48 are made with a conductive material, such as Al, Cu, Sn, Ni, Au, or Ag, and are electrically connected to the circuit elements formed within die 16. Contact pads 48 are formed by PVD, CVD, electrolytic plating, or electroless plating process. Wire bonds 54 and bond pads 56 and 58 electrically connect contact pads 48 of semiconductor die 16 to contact pads 52 of BCC 22 forming the first level packaging. Mold compound or encapsulant 60 is deposited over semiconductor die 16, wire bonds 54, contact pads 48, and contact pads 52 to provide physical support and electrical isolation for the device. Contact pads 64 are formed on a surface of PCB 12 using evaporation, electrolytic plating, electroless plating, screen printing, or other suitable metal deposition process and are typically plated to prevent oxidation. Contact pads 64 electrically connect to one or more conductive signal traces 14. Solder material is deposited between contact pads 52 of BCC 22 and contact pads 64 of PCB 12. The solder material is reflowed to form bumps 66 which form a mechanical and electrical connection between BCC 22 and PCB 12.

Figure 2C:
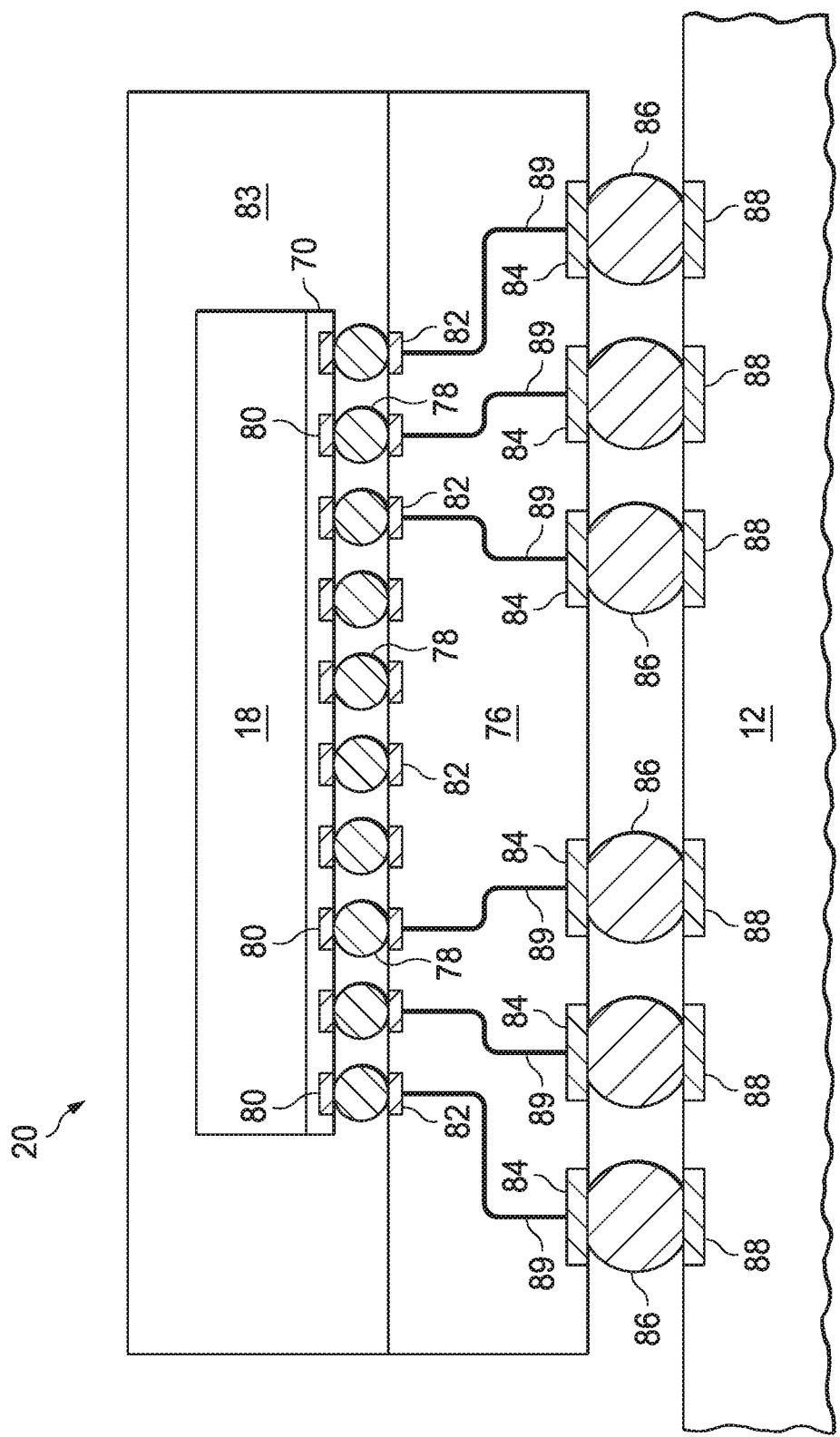

In FIG. 2c, semiconductor die 18 is mounted face down to carrier 76 with a flip chip style first level packaging. BGA 20 is attached to PCB 12 with a BGA style second level packaging. Active area 70 containing analog or digital circuits implemented as active devices, passive devices, conductive layers, and dielectric layers formed within semiconductor die 18 is electrically interconnected according to the electrical design of the die. For example, the circuit may include one or more transistors, diodes, inductors, capacitors, resistors, and other circuit elements formed within active area 70 of semiconductor die 18. Semiconductor die 18 is electrically and mechanically attached to the carrier 76 through a large number of individual conductive solder bumps or balls 78. Solder bumps 78 are formed on bump pads or interconnect sites 80, which are disposed on active areas 70. Bump pads 80 are made with a conductive material, such as Al, Cu, Sn, Ni, Au, or Ag, and are electrically connected to the circuit elements formed in active area 70. Bump pads 80 are formed by PVD, CVD, electrolytic plating, or electroless plating process. Solder bumps 78 are electrically and mechanically connected to contact pads or interconnect sites 82 on carrier 76 by a solder reflow process.

BGA 20 is electrically and mechanically attached to PCB 12 by a large number of individual conductive solder bumps or balls 86. The solder bumps are formed on bump pads or interconnect sites 84. The bump pads 84 are electrically connected to interconnect sites 82 through conductive lines 89 routed through carrier 76. Contact pads 88 are formed on a surface of PCB 12 using evaporation, electrolytic plating, electroless plating, screen printing, or other suitable metal deposition process and are typically plated to prevent oxidation. Contact pads 88 electrically connect to one or more conductive signal traces 14. The solder bumps 86 are electrically and mechanically connected to contact pads or bonding pads 88 on PCB 12 by a solder reflow process. Mold compound or encapsulant 83 is deposited over semiconductor die 18 and carrier 76 to provide physical support and electrical isolation for the device. The flip chip semiconductor device provides a short electrical conduction path from the active devices on semiconductor die 18 to conduction tracks on PCB 12 in order to reduce signal propagation distance, lower capacitance, and achieve overall better circuit performance. In another embodiment, the semiconductor die 18 can be mechanically and electrically attached directly to PCB 12 using flip chip style first level packaging without carrier 76.

Figure 3C:
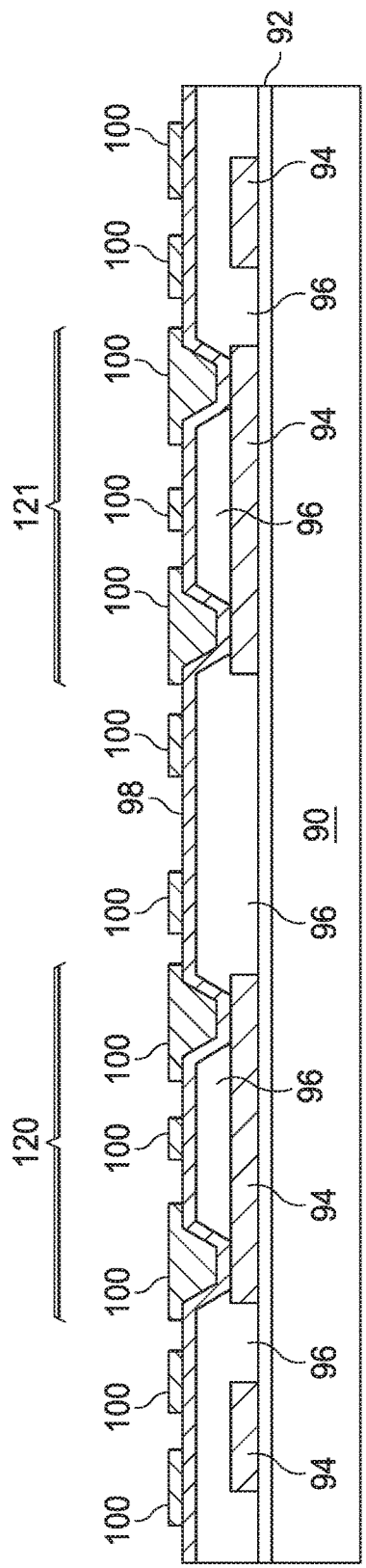

FIGS. 3a-3g illustrate a process of creating an integrated passive device (IPD) with embedded electromagnetic interference (EMI) shielding. In FIG. 3a, an insulation layer 92 is formed on semiconductor wafer 90. Insulation layer 92 provides stress relief for subsequent layers and operates as an etch stop. Insulation layer 92 is typically silicon dioxide (SiO2), but can also be silicon nitride (Si3N4), silicon oxynitride (SiON), tantalum pentoxide (Ta2O5), zircon (ZrO2), aluminum oxide (Al2O3), or other material having insulating properties. The deposition of insulation layer 92 may involve PVD, CVD, printing and sintering, or thermal oxidation and result in a thickness ranging from 100-5000 angstroms (Å).

Conductive layer 94 is formed over insulation layer 92. Conductive layer 94 can be Al, Cu, Sn, Ni, Au, Ag, tungsten (W), or other suitable electrically conductive material. Conductive layer 94 can have optional adhesion and barrier layers formed underneath or over the conductive layer. The adhesion and barrier layers can be titanium (Ti), titanium tungsten (TiW), titanium nitride (TiN), tantalum (Ta), or tantalum nitride (TaN). Conductive layer 94 can be deposited using PVD, CVD, electrolytic plating, or electroless plating process. Conductive layer 94 is patterned and etched using photolithography to form individual portions or sections. The individual portions of conductive layer 94 can be electrically common or electrically isolated depending on the connectivity of the individual semiconductor die formed on semiconductor wafer 90.

In FIG. 3b, a passivation layer 96 is formed over conductive layer 94 and insulation layer 92. Passivation layer 96 can be polyimide, benzocyclobutene (BCB), polybenzoxazoles (PBO), SiO2, Si3N4, SiON, Ta2O5, Al2O3, or other suitable material having insulating properties. The deposition of passivation layer 96 may involve spin coating, PVD, CVD, printing and sintering, or thermal oxidation. After passivation layer 96 is deposited, it can be patterned using photolithography to form individual portions or sections which expose conductive layer 94 as shown.

In FIG. 3c, a seed layer 98 is formed over passivation layer 96 and conductive layer 94. The seed layer 98 can be Al, Cu, Sn, Ni, Au, Ag, or combination of these materials with proper adhesion layer such as Ti, TiW, TiN, Ta/TaN, Cu, or other electrically conductive material. The deposition of seed layer 98 may involve PVD, CVD, or other suitable process. A conductive layer 100 is formed over seed layer 98. Conductive layer 100 can be deposited using typically selectively electrolytic plating, but can be PVD, CVD, or electroless plating process. Conductive layer 100 is patterned and etched using photolithography to form individual portions or sections. The individual portions of conductive layer 100 can be electrically common or electrically isolated depending on the connectivity of the individual semiconductor die formed on semiconductor wafer 90. The individual sections of conductive layer 100 form part of inductor 120 and inductor 121. The conductive layer 100 is typically wound or coiled in plan-view, as shown in the cross-sectional view of FIG. 3c, to produce or exhibit the desired inductive properties. The inductors 120 and 121 constitute one type of IPD that can be formed on semiconductor wafer 90. Other active and passive circuit elements can be formed on semiconductor wafer 90 as part of the electrically functional semiconductor device.

In one embodiment, the conductive layer 100 can be Cu and formed by a plating process. A thick layer of photoresist is deposited over seed layer 98. The photoresist thickness ranges from 10-30 micrometers (μm). The photoresist is patterned using photolithography. Cu is deposited over seed layer 98 in the patterned area of photoresist using evaporation, electrolytic plating, electroless plating, or other suitable metal deposition process. The photoresist is removed leaving behind conductive layer sections 100.

Figure 3D:
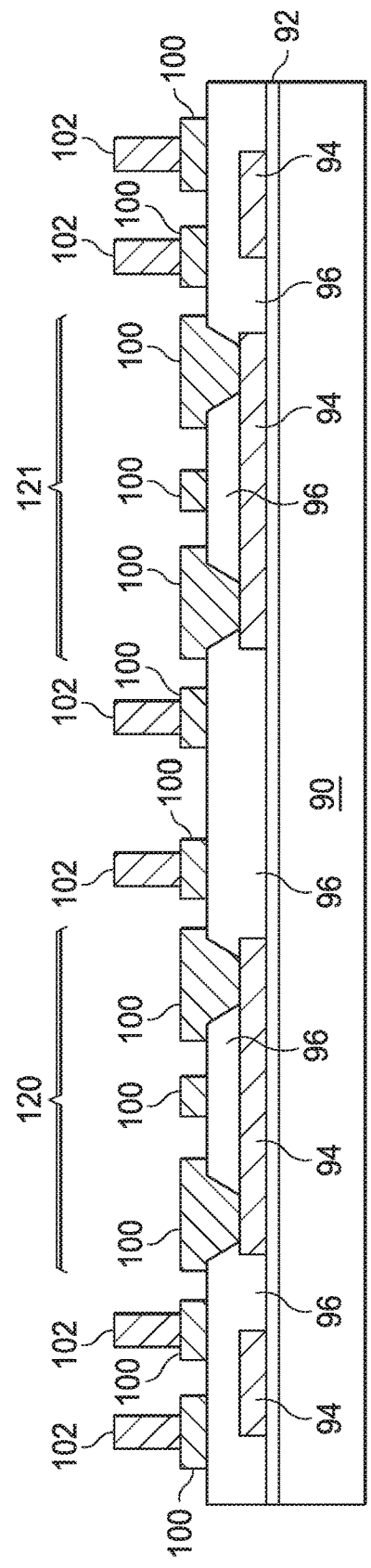

In FIG. 3d, conductive pillars 102 are conductive channels formed over conductive layer 100. Conductive pillars 102 can be Cu, Al, W, or other suitable conductive material. The individual conductive pillars 102 form part of a cage structure around inductor 120 and inductor 121 to protect the inductors from EMI. The conductive pillars 102 also provide thermal transfer properties to remove heat from the die. After conductive pillars 102 are formed, seed layer 98 is removed in areas exposed by conductive layer 100.

In one embodiment, the conductive pillars 102 can be Cu and formed by a plating process. A thick layer of photoresist is deposited over seed layer 98 and conductive layer 100. The photoresist can be a liquid or a dry film with a thickness of 50 to 125 μm typically. Two layers of photoresist may be applied to achieve the desired thickness. The photoresist is patterned using photolithography. Cu is deposited in the patterned areas of the photoresist using electrolytic plating. The photoresist is stripped away leaving behind individual conductive pillars 102.

In another embodiment, the conductive pillars 102 can be replaced with solder balls. An adhesion layer may be deposited and patterned on conductive layer 100 and seed layer 98. The adhesion layer and seed layer 98 are removed in areas exposed by conductive layer 100 by an etching process. An additional passivation layer may be formed over passivation layer 96 and conductive layer 100 to provide structural support and electrical isolation. The additional passivation layer is patterned to expose portions of conductive layer 100. Solder balls are formed over the conductive layer 100 in the patterned areas of the additional passivation layer.

Figure 3E:
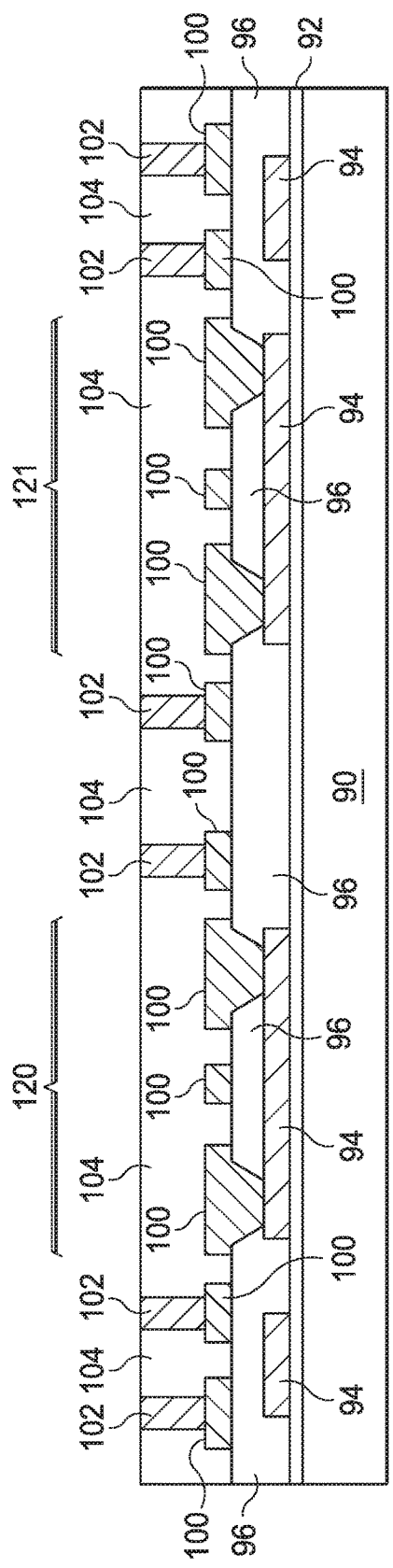

In FIG. 3e, an encapsulation material 104 is deposited over the conductive layer 100 and passivation layer 96. Encapsulation material 104 provides structural support, warpage control, and electrical isolation. Encapsulation material 104 may be any suitable insulating material such as molding compound, polyimide, BCB, PBO, or epoxy based insulating polymer. An adhesion layer may be applied to conductive pillars 102 and exposed areas of conductive layer 100 to improve adhesion with encapsulation material 104. Residue or excess encapsulation material 104 is removed and the surface cleaned to expose the top of conductive pillars 102.

Figure 3F:
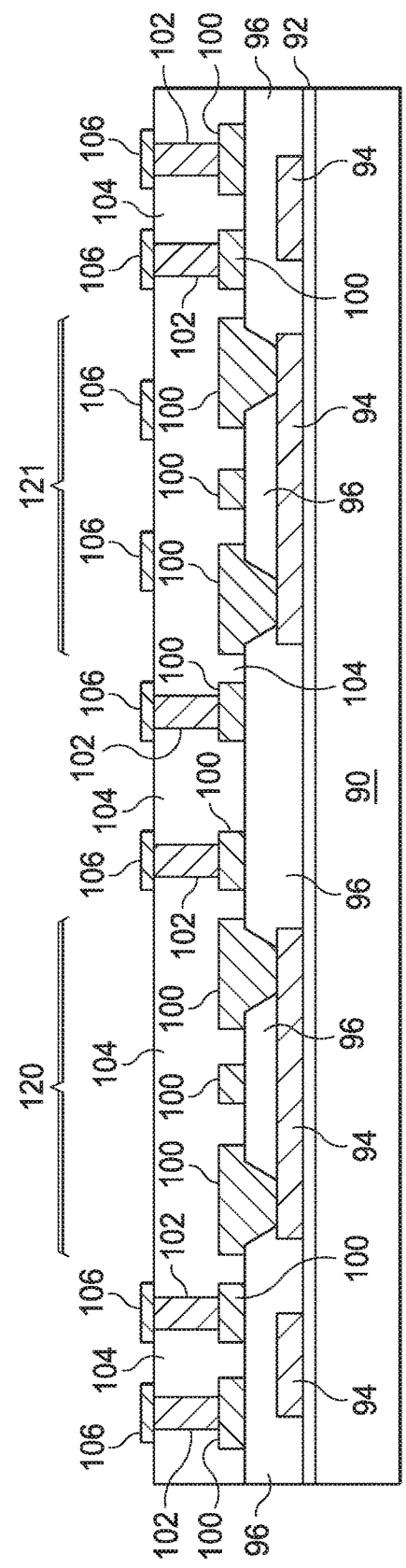

In FIG. 3f, a conductive layer 106 is formed over conductive layer 102 and encapsulation material 104 using PVD, CVD, evaporation, electrolytic plating, electroless plating, or other suitable metal deposition process. The conductive layer 106 can be Cu, Al, W, or other conductive material. Conductive layer 106 can be a metal stack containing an adhesion layer and seed layer. Conductive layer 106 is patterned to form individual portions or sections. The individual sections of conductive layer 106 form part of an EMI shield cage structure for inductor 120 and inductor 121. An additional passivation layer can optionally be formed over conductive layer 106 and encapsulation material 104 to provide additional environmental protection and electrical isolation for the underlying structures.

In FIG. 3g, the singulated die 130 is surface mounted to a carrier 112. The carrier 112 can be a PCB, semiconductor device, or another die. In one embodiment, the singulated die 130 is mounted to carrier 112 using solder bumps 108. Solder bumps 108 form an electrical connection between conductive layer 106 and bonding sites 110 on carrier 112.

FIG. 4a shows a top view of inductor with embedded EMI shielding similar to inductor 120 in FIG. 3g. Inductor 200 lies under encapsulation material 202. Inductor 200 has a conductive layer similar to conductive layer 100 in FIG. 3g. Encapsulation material 202 is similar to encapsulation material 104 in FIG. 3g. EMI shield 204 has a conductive layer similar to conductive layer 106 in FIG. 3g. EMI shield 204 forms a shield over and around inductor 200, shielding inductor 200 from EMI without degrading inductor performance.

FIG. 4b shows a top view of inductor with embedded EMI shielding similar to inductor 121 in FIG. 3g. Inductor 206 lies under encapsulation material 210 and EMI shield 208. Inductor 206 has a conductive layer similar to conductive layer 100 in FIG. 3G. Encapsulation material 210 is similar to encapsulation material 104 in FIG. 3g. EMI shield 208 has a conductive layer similar to conductive layer 106 in FIG. 3g. EMI shield 208 forms a shield over inductor 206, shielding inductor 206 from EMI without degrading inductor performance.

The IPDs contained within semiconductor wafer 90 provide the electrical characteristics needed for high frequency applications, such as resonators, high-pass filters, low-pass filters, band-pass filters, symmetric Hi-Q resonant transformers, matching networks, and tuning capacitors. The IPDs can be used as front-end wireless RF components, which can be positioned between the antenna and transceiver. The IPD inductor can be a hi-Q balun, transformer, or coil, operating up to 100 Gigahertz. In some applications, multiple baluns are formed on a same substrate, allowing multi-band operation. For example, two or more baluns are used in a quad-band for mobile phones or other global system for mobile (GSM) communications, each balun dedicated for a frequency band of operation of the quad-band device. A typical RF system requires multiple IPDs and other high frequency circuits in one or more semiconductor packages to perform the necessary electrical functions. However, high frequency electrical devices generate or may be susceptible to undesired EMI, RFI, or other inter-device interference, such as capacitive, inductive, or conductive coupling, also known as cross-talk.

Figure 5:
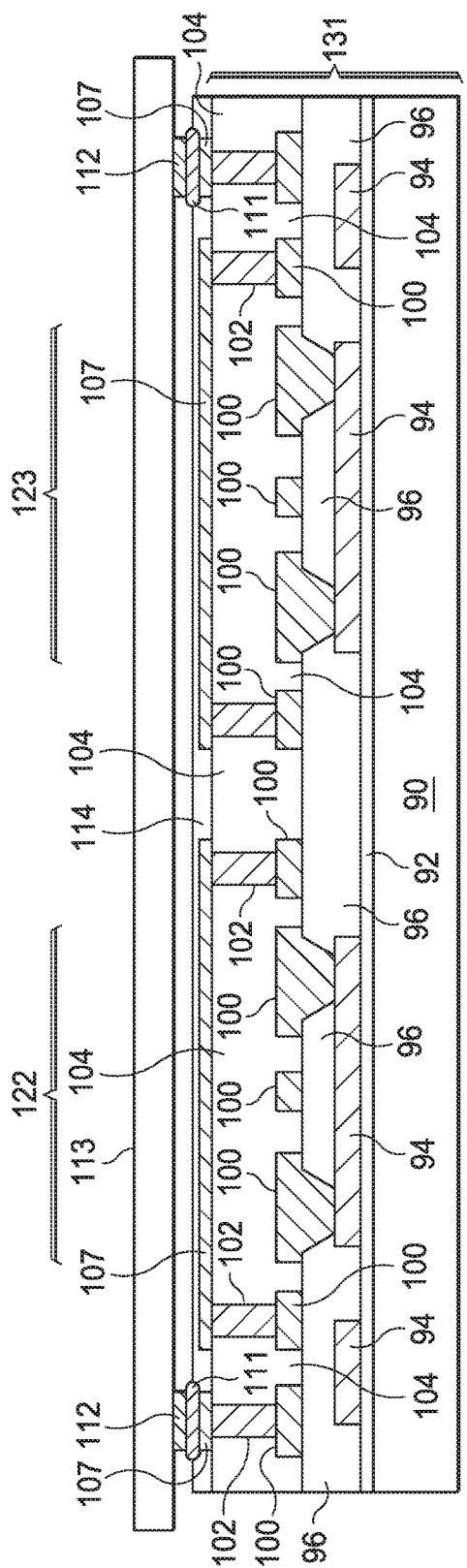
FIG. 5 illustrates an IPD protected by an embedded EMI shielding structure with enhanced thermal characteristics with a layer of wafer level passivation.

Another embodiment of IPD devices with embedded EMI shielding and enhanced thermal conductivity is shown in FIG. 5. IPD 122 and IPD 123 are formed on substrate 90. An insulation layer 92 is formed over substrate 90. Insulation layer 92 provides stress relief for subsequent layers and operates as an etch stop. Insulation layer 92 is typically SiO2, but can also be Si3N4, SiON, Ta2O5, ZrO2, Al2O3, or other material having insulating properties. The deposition of insulation layer 92 may involve PVD, CVD, printing and sintering, or thermal oxidation and result in a thickness ranging from 100-5000 Å. A conductive layer 94 is patterned and deposited over insulation layer 92 using electrolytic plating. Conductive layer 94 can be Al, Cu, Sn, Ni, Au, Ag, W, or other suitable electrically conductive material. Conductive layer 94 can have optional adhesion and barrier layers formed underneath or over the conductive layer. The adhesion and barrier layers can be Ti, TiW, TiN, Ta, or TaN. Conductive layer 94 can be deposited using PVD, CVD, electrolytic plating, or electroless plating process. Conductive layer 94 is patterned and etched using photolithography to form individual portions or sections. The individual portions of conductive layer 94 can be electrically common or electrically isolated depending on the connectivity of the individual semiconductor die formed on semiconductor wafer 90.

Passivation layer 96 is deposited and patterned over conductive layer 94 and insulation layer 92 using photolithography. Passivation layer 96 can be polyimide, BCB, PBO, SiO2, Si3N4, SiON, Ta2O5, Al2O3, or other suitable material having insulating properties. The deposition of passivation layer 96 may involve spin coating, PVD, CVD, printing and sintering, or thermal oxidation. After passivation layer 96 is deposited, it can be patterned using photolithography to form individual portions or sections. Conductive layer 100 is patterned and deposited over passivation layer 96 and conductive layer 94. Conductive layer 100 can be Al, Cu, Sn, Ni, Au, Ag, W, or other suitable electrically conductive material. Conductive layer 100 can have optional adhesion and barrier layers formed underneath or over the conductive layer. The adhesion and barrier layers can be Ti, TiW, TiN, Ta, or TaN. Conductive layer 100 can be deposited using PVD, CVD, electrolytic plating, or electroless plating process. Conductive layer 100 is patterned and etched using photolithography to form individual portions or sections. The individual portions of conductive layer 100 can be electrically common or electrically isolated depending on the connectivity of the individual semiconductor die formed on semiconductor wafer 90.

Conductive pillars 102 are formed over conductive layer 100. Conductive pillars 102 can be Cu and formed by a plating process. A thick layer of photoresist is deposited over conductive layer 100. The photoresist can be a liquid or a dry film with a thickness of 50-125 μm. Two layers of photoresist may be applied to achieve the desired thickness. The photoresist is patterned using photolithography. Cu is deposited in the patterned areas of the photoresist using electrolytic plating. The photoresist is stripped away leaving behind individual conductive pillars 102. Conductive pillars 102 form a cage to protect IPD 122 and IPD 123 from EMI.

An optional insulation layer can be formed over conductive layer 100 and passivation layer 96 for additional electrical isolation. Encapsulation material 104 is deposited over conductive layer 100 and passivation layer 96 or optional insulation layer to provide environmental protection and electrical isolation for the underlying structures. Encapsulation material 104 may be any suitable insulating material such as molding compound, polyimide, BCB, PBO, or epoxy based insulating polymer.

Conductive layer 107 is formed over conductive pillars 102 and encapsulation 104. Conductive layer 107 can be Al, Cu, Sn, Ni, Au, Ag, W, or other suitable electrically conductive material. Conductive layer 107 can have optional adhesion and barrier layers formed underneath or over the conductive layer. The adhesion and barrier layers can be Ti, TiW, TiN, Ta, or TaN. Conductive layer 107 can be deposited using PVD, CVD, electrolytic plating, or electroless plating process. Conductive layer 107 is patterned and etched using photolithography to form individual portions or sections. The individual portions of conductive layer 107 form an EMI shielding layer above IPD 122 and IPD 123. Conductive layer 107 and conductive pillars 102 together form an embedded EMI shield cage structure to protect IPD 122 and IPD 123 from EMI.

A passivation layer 114 is formed over conductive layer 107 and encapsulation layer 104. Passivation layer 114 can be polyimide, BCB, PBO, SiO2, Si3N4, SiON, Ta2O5, Al2O3, or other suitable material having insulating properties. The deposition of passivation layer 114 may involve spin coating, PVD, CVD, printing and sintering, or thermal oxidation. After passivation layer 114 is deposited, it can be patterned using photolithography to form individual portions or sections. The passivation layer 114 provides additional environmental protection and electrical isolation for the underlying structures.

Singulated die 131 is mounted to carrier 113. Carrier 113 can be a PCB, semiconductor device, or another die. Solder bumps 111 form the mounting points that serve as the structural and electrical connection between the singulated die 131 and carrier 113. Solder bumps 111 form an electrical connection between conductive layer 107 and bonding sites 112 on carrier 113. The copper pillars 102 have high thermal conductivity and can improve the performance of the singulated die 131 by transferring heat to carrier 113.

Figure 6:
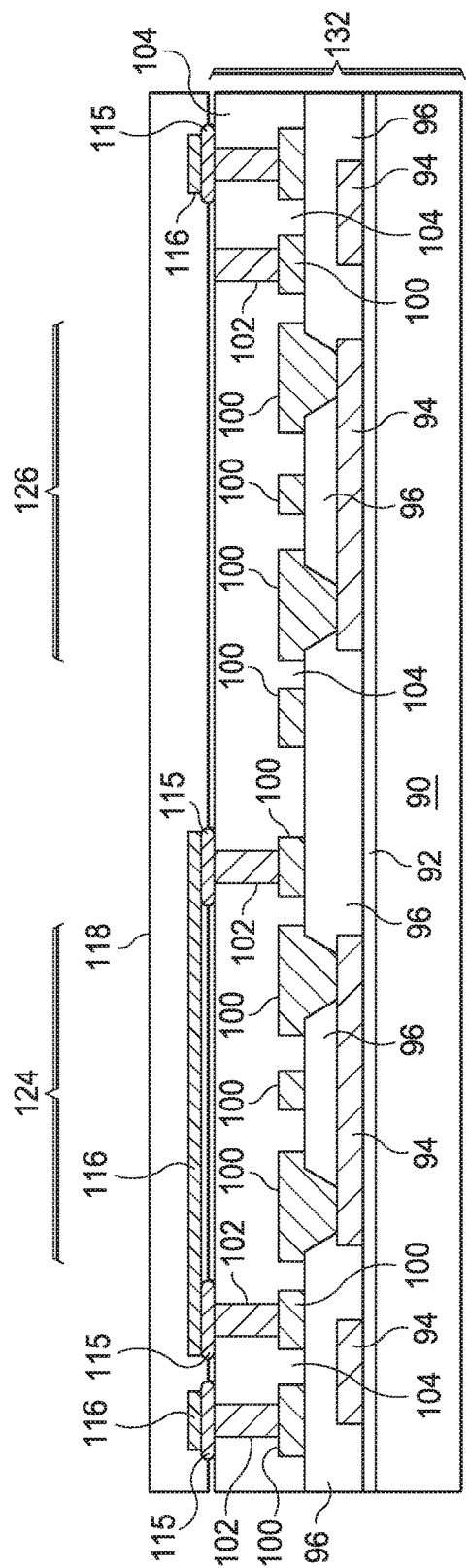
FIG. 6 illustrates an IPD protected by an embedded EMI shielding structure with enhanced thermal characteristics partially formed in the carrier.

Another embodiment of IPD devices with embedded EMI shielding and enhanced thermal conductivity is shown in FIG. 6. IPD 124 and IPD 126 are formed on substrate 90. An insulation layer 92 is formed over substrate 90. Insulation layer 92 provides stress relief for subsequent layers and operates as an etch stop. Insulation layer 92 is typically SiO2, but can also be Si3N4, SiON, Ta2O5, ZrO2, Al2O3, or other material having insulating properties. The deposition of insulation layer 92 may involve PVD, CVD, printing and sintering, or thermal oxidation and result in a thickness ranging from 100-5000 Å.

A conductive layer 94 is patterned and deposited over insulation layer 92 using electrolytic plating. Conductive layer 94 can be Al, Cu, Sn, Ni, Au, Ag, W, or other suitable electrically conductive material. Conductive layer 94 can have optional adhesion and barrier layers formed underneath or over the conductive layer. The adhesion and barrier layers can be Ti, TiW, TiN, Ta, or TaN. Conductive layer 94 can be deposited using PVD, CVD, electrolytic plating, or electroless plating process. Conductive layer 94 is patterned and etched using photolithography to form individual portions or sections. The individual portions of conductive layer 94 can be electrically common or electrically isolated depending on the connectivity of the individual semiconductor die formed on semiconductor wafer 90.

Passivation layer 96 is deposited and patterned over conductive layer 94 and insulation layer 92 using photolithography. Passivation layer 96 can be polyimide, BCB, PBO, SiO2, Si3N4, SiON, Ta2O5, Al2O3, or other suitable material having insulating properties. The deposition of passivation layer 96 may involve spin coating, PVD, CVD, printing and sintering, or thermal oxidation. After passivation layer 96 is deposited, it can be patterned using photolithography to form individual portions or sections.

Conductive layer 100 is patterned and deposited over passivation layer 96 and conductive layer 94. Conductive layer 100 can be Al, Cu, Sn, Ni, Au, Ag, W, or other suitable electrically conductive material. Conductive layer 100 can have optional adhesion and barrier layers formed underneath or over the conductive layer. The adhesion and barrier layers can be Ti, TiW, TiN, Ta, or TaN. Conductive layer 100 can be deposited using PVD, CVD, electrolytic plating, or electroless plating process. Conductive layer 100 is patterned and etched using photolithography to form individual portions or sections. The individual portions of conductive layer 100 can be electrically common or electrically isolated depending on the connectivity of the individual semiconductor die formed on semiconductor wafer 90.

Conductive pillars 102 are formed over conductive layer 100. Conductive pillars 102 can be Cu and formed by a plating process. A thick layer of photoresist is deposited over seed layer 98 and conductive layer 100. The photoresist can be a liquid or a dry film with a thickness of 50-125 μm. Two layers of photoresist may be applied to achieve the desired thickness. The photoresist is patterned using photolithography. Cu is deposited in the patterned areas of the photoresist using electrolytic plating. The photoresist is stripped away leaving behind individual conductive pillars 102. Conductive pillars 102 form a cage structure to protect IPD 122 and IPD 123 from EMI.

An optional insulation layer can be formed over conductive layer 100 and passivation layer 96 for additional electrical isolation. Encapsulation material 104 is deposited over conductive layer 100 and passivation layer 96 or optional insulation layer to provide environmental protection and electrical isolation for the underlying structures. Encapsulation material 104 may be any suitable insulating material such as molding compound, polyimide, BCB, PBO, or epoxy based insulating polymer.

Conductive layer 116 is formed on carrier 118 using electrolytic plating. Carrier 118 can be a PCB, semiconductor device, or another die. Singulated die 132 is mounted to carrier 118. Solder bumps 115 form the mounting points that serve as the structural and electrical connection between the singulated die 132 and the carrier 118. Conductive layer 116 forms an EMI shielding layer above IPD 124. The conductive layer 116 and conductive pillars 102 together form an embedded EMI shield cage structure to protect IPD 124 from EMI. The copper pillars 102 have high thermal conductivity and can improve the performance of the singulated die 132 by transferring heat to carrier 118.

Figure 7:
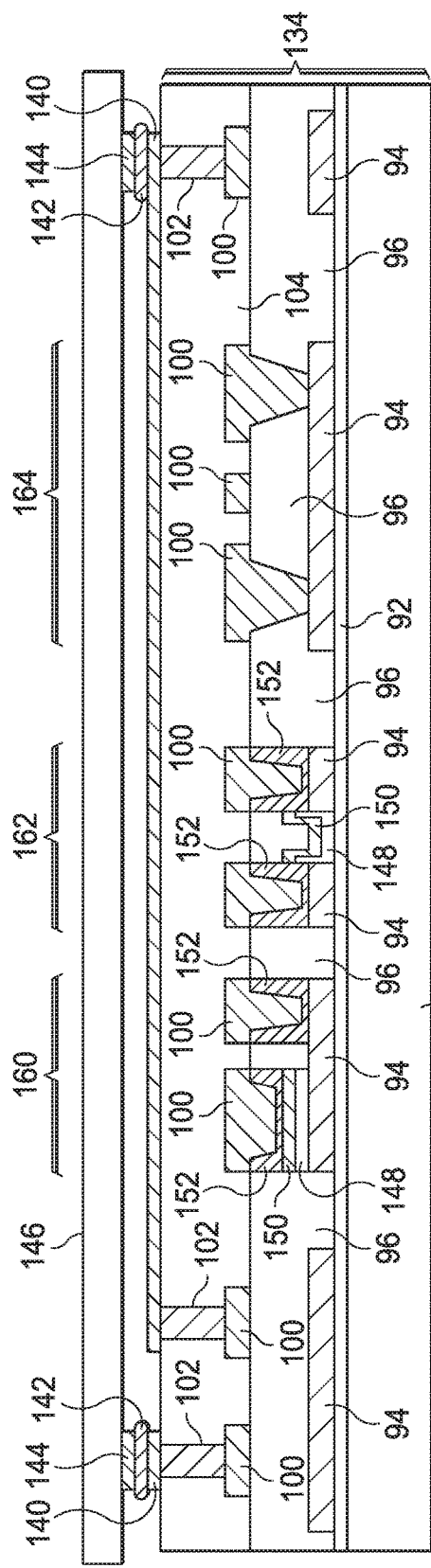
FIG. 7 illustrates multiple IPDs all protected with the same embedded EMI shielding structure with enhanced thermal characteristics.

Another embodiment of IPD devices with embedded EMI shielding and enhanced thermal conductivity is shown in FIG. 7. Multiple IPD devices, such as capacitor 160, resistor 162, and inductor 164, are formed on semiconductor wafer 90. An insulation layer 92 is formed over substrate 90. Insulation layer 92 provides stress relief for subsequent layers and operates as an etch stop. Insulation layer 92 is typically SiO2, but can also be Si3N4, SiON, Ta2O5, ZrO2, Al2O3, or other material having insulating properties. The deposition of insulation layer 92 may involve PVD, CVD, printing and sintering, or thermal oxidation and result in a thickness ranging from 100-5000 Å.

A conductive layer 94 is patterned and deposited over insulation layer 92. Conductive layer 94 can be Al, Cu, Sn, Ni, Au, Ag, W, or other suitable electrically conductive material. Conductive layer 94 can have optional adhesion and barrier layers formed underneath or over the conductive layer. The adhesion and barrier layers can be Ti, TiW, TiN, Ta, or TaN. Conductive layer 94 can be deposited using PVD, CVD, electrolytic plating, or electroless plating process. Conductive layer 94 is patterned and etched using photolithography to form individual portions or sections. The individual portions of conductive layer 94 can be electrically common or electrically isolated depending on the connectivity of the individual semiconductor die formed on semiconductor wafer 90.

Passivation layer 96 is deposited and patterned over conductive layer 94 and insulation layer 92 using photolithography. An insulation layer 148 is formed over conductive layer 94 and insulation layer 92 and patterned. Insulation layer 148 can be SiO2, Si3N4, SiON, Ta2O5, ZrO2, Al2O3, or other material having insulating properties. The deposition of insulation layer 148 may involve PVD, CVD, printing and sintering, or thermal oxidation.

A resistive layer 150 is formed over insulation layer 148 and patterned. Resistive layer 150 can be tantalum silicide (TaxSiy) or other metal silicides, TaN, nickel chromium (NiCr), TiN, or doped poly-silicon having and formed as necessary to achieve the desired resistivity. Resistive layer 150 can be formed using PVD, CVD, or other suitable process.

Conductive layer 152 is formed over resistive layer 150 and conductive layer 94 and patterned. Insulation layer 148, resistive layer 150, and conductive layer 152 form part of metal-insulator-metal (MIM) capacitor 160 and resistor 162. Conductive layer 100 is patterned and deposited over passivation layer 96, conductive layer 94, and conductive layer 152. Conductive layer 100 can be Al, Cu, Sn, Ni, Au, Ag, W, or other suitable electrically conductive material. Conductive layer 100 can have optional adhesion and barrier layers formed underneath or over the conductive layer. The adhesion and barrier layers can be Ti, TiW, TiN, Ta, or TaN. Conductive layer 100 can be deposited using PVD, CVD, electrolytic plating, or electroless plating process. Conductive layer 100 is patterned and etched using photolithography to form individual portions or sections. The individual portions of conductive layer 100 can be electrically common or electrically isolated depending on the connectivity of the individual semiconductor die formed on semiconductor wafer 90.

Conductive pillars 102 are formed over conductive layer 100. Conductive pillars 102 can be Cu and formed by a plating process. A thick layer of photoresist is deposited over seed layer 98 and conductive layer 100. The photoresist can be a liquid or a dry film with a thickness of 50-125 μm. Two layers of photoresist may be applied to achieve the desired thickness. The photoresist is patterned using photolithography. Cu is deposited in the patterned areas of the photoresist using electrolytic plating. The photoresist is stripped away leaving behind individual conductive pillars 102. Conductive pillars 102 form a cage structure to protect capacitor 160, resistor 162, and inductor 164 from EMI.

An optional insulation layer can be formed over conductive layer 100 and passivation layer 96 for additional electrical isolation. Encapsulation material 104 is deposited over conductive layer 100 and passivation layer 96 or optional insulation layer to provide environmental protection and electrical isolation for the underlying structures. Encapsulation material 104 may be any suitable insulating material such as molding compound, polyimide, BCB, PBO, or epoxy based insulating polymer.

Conductive layer 140 is formed over conductive pillars 102 and encapsulation material 104. Conductive layer 140 can be Al, Cu, Sn, Ni, Au, Ag, W, or other suitable electrically conductive material. Conductive layer 140 can have optional adhesion and barrier layers formed underneath or over the conductive layer. The adhesion and barrier layers can be Ti, TiW, TiN, Ta, or TaN. Conductive layer 140 can be deposited using PVD, CVD, electrolytic plating, or electroless plating process. Conductive layer 140 is patterned and etched using photolithography to form individual portions or sections. The individual portions of conductive layer 140 form a shielding layer to protect capacitor 160, resistor 162, and inductor 164 from EMI. The conductive layer 140 and conductive pillars 102 together form an embedded EMI shield cage structure to protect capacitor 160, resistor 162, and inductor 164 from EMI.

Singulated die 134 is mounted to carrier 146. Carrier 146 can be a PCB, semiconductor device, or another die. Solder bumps 142 form the mounting points that serve as the structural and electrical connection between the singulated die 134 and the carrier 146. Solder bumps 142 form an electrical connection between conductive layer 140 and bonding sites 144 on carrier 146. The copper pillars 102 have high thermal conductivity and can improve the performance of the singulated die 134 by transferring heat to carrier 146.

Figure 8:
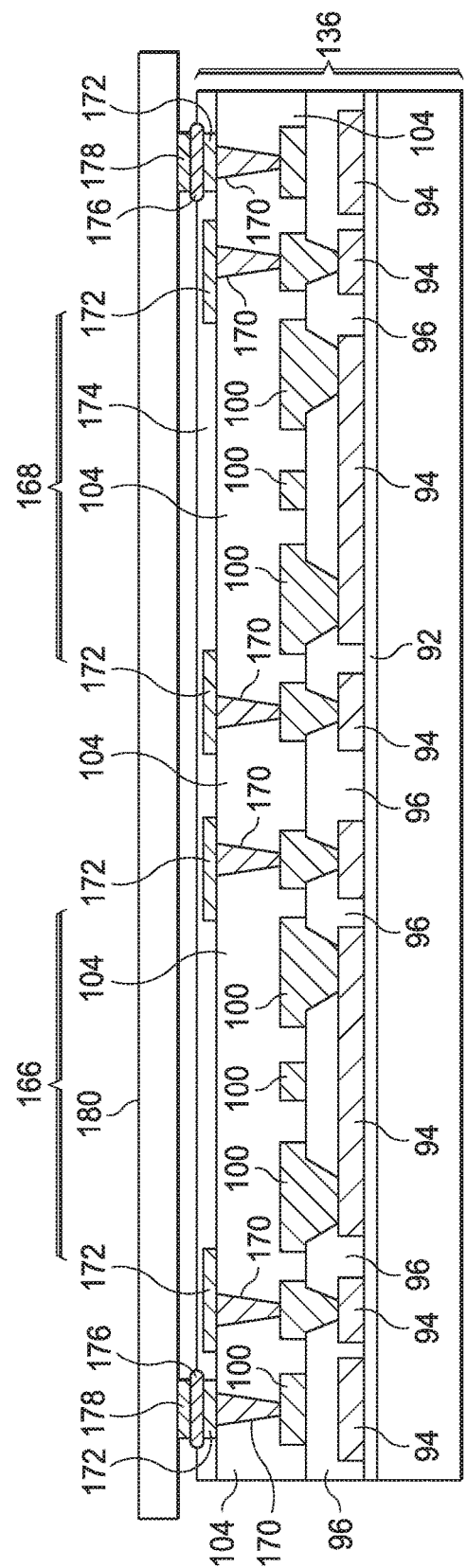
FIG. 8 illustrates an IPD protected by an embedded EMI shielding structure formed by the combination of metal layers.
Figure 9:
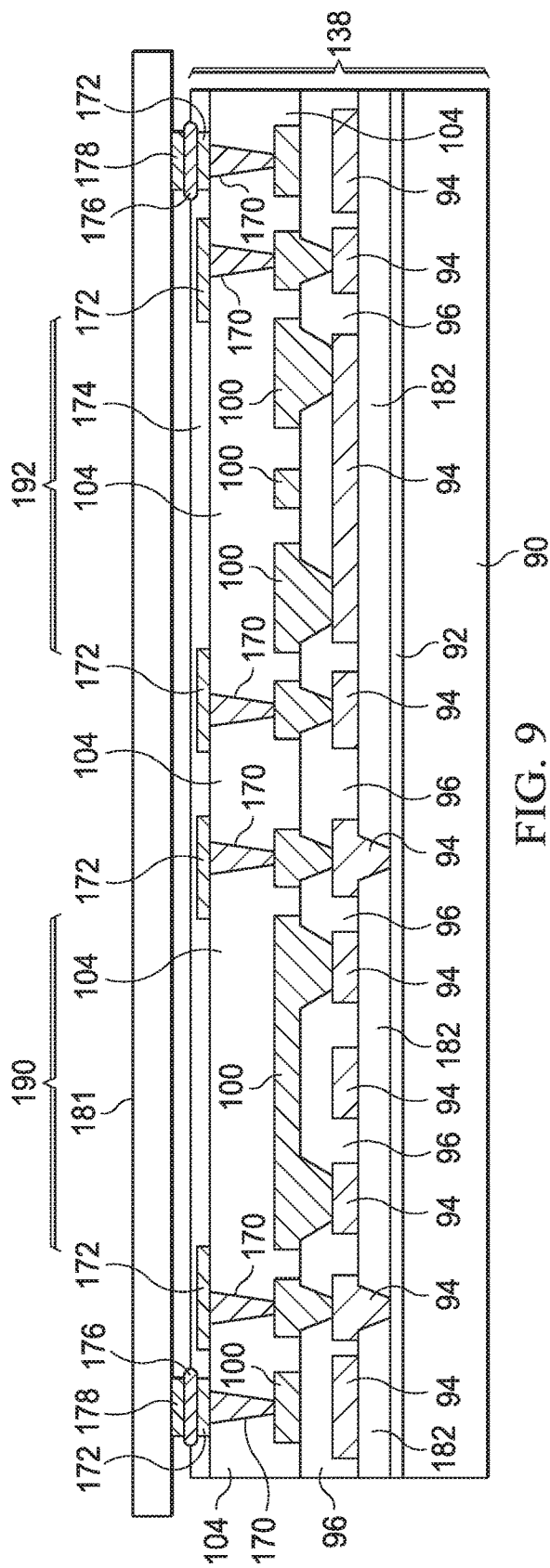
FIG. 9 illustrates an IPD protected by an embedded EMI shielding structure formed by the combination of metal layers extending to the first insulation layer.

Embodiments of an IPD device with embedded EMI shielding and enhanced thermal conductivity that is particularly useful for controlling mutual inductance between IPDs are shown in FIGS. 8-9. Mutual inductance is the electromagnetic coupling of a first and second circuit. Mutual inductance can interfere with the operation of an IPD. Mutual inductance between two respective circuits occurs when each circuit is located within the electromagnetic field of the other circuit. For example, current flow through a first circuit creates an electromagnetic field around the first circuit. A second circuit brought within the electromagnetic field of the first circuit experiences a voltage change induced by the electromagnetic field. In likewise fashion, current flow through the second circuit creates an electromagnetic field around the second circuit, inducing a voltage change in the first circuit.

In FIG. 8, IPD 166 and IPD 168 are formed on substrate 90. An insulation layer 92 is formed over substrate 90. Insulation layer 92 provides stress relief for subsequent layers and operates as an etch stop. Insulation layer 92 is typically SiO2, but can also be Si3N4, SiON, Ta2O5, ZrO2, Al2O3, or other material having insulating properties. The deposition of insulation layer 92 may involve PVD, CVD, printing and sintering, or thermal oxidation and result in a thickness ranging from 100-5000 Å.

A conductive layer 94 is patterned and deposited over insulation layer 92 using electrolytic plating. Conductive layer 94 can be Al, Cu, Sn, Ni, Au, Ag, W, or other suitable electrically conductive material. Conductive layer 94 can have optional adhesion and barrier layers formed underneath or over the conductive layer. The adhesion and barrier layers can be Ti, TiW, TiN, Ta, or TaN. Conductive layer 94 can be deposited using PVD, CVD, electrolytic plating, or electroless plating process. Conductive layer 94 is patterned and etched using photolithography to form individual portions or sections. The individual portions of conductive layer 94 can be electrically common or electrically isolated depending on the connectivity of the individual semiconductor die formed on semiconductor wafer 90.

Passivation layer 96 is deposited and patterned over conductive layer 94 and insulation layer 92 using photolithography. Passivation layer 96 can be polyimide, BCB, PBO, SiO2, Si3N4, SiON, Ta2O5, Al2O3, or other suitable material having insulating properties. The deposition of passivation layer 96 may involve spin coating, PVD, CVD, printing and sintering, or thermal oxidation. After passivation layer 96 is deposited, it can be patterned using photolithography to form individual portions or sections.

Conductive layer 100 is patterned and deposited over passivation layer 96 and conductive layer 94. Conductive layer 100 can be Al, Cu, Sn, Ni, Au, Ag, W, or other suitable electrically conductive material. Conductive layer 100 can have optional adhesion and barrier layers formed underneath or over the conductive layer. The adhesion and barrier layers can be Ti, TiW, TiN, Ta, or TaN. Conductive layer 100 can be deposited using PVD, CVD, electrolytic plating, or electroless plating process. Conductive layer 100 is patterned and etched using photolithography to form individual portions or sections. The individual portions of conductive layer 94 can be electrically common or electrically isolated depending on the connectivity of the individual semiconductor die formed on semiconductor wafer 90.

Encapsulation material 104 is deposited over conductive layer 100 and passivation layer 96. Encapsulation material 104 provides structural support, warpage control, and electrical isolation. Encapsulation material 104 may be any suitable insulating material such as molding compound, polyimide, BCB, PBO, or epoxy based insulating polymer. Encapsulation material 104 is patterned using photolithography to form a plurality of openings exposing conductive layer 100. Conductive and thermal vias 170 are formed by filling the openings with a conductive material. The vias can be Al, Cu, Sn, Ni, Ag, Au, W, or other suitable conductive material which can form a conductive channel.

Conductive layer 172 is formed over the vias 170 and encapsulant 104. Conductive layer 172 can be Al, Cu, Sn, Ni, Au, Ag, W, or other suitable electrically conductive material. Conductive layer 172 can have optional adhesion and barrier layers formed underneath or over the conductive layer. The adhesion and barrier layers can be Ti, TiW, TiN, Ta, or TaN. Conductive layer 172 can be deposited using PVD, CVD, electrolytic plating, or electroless plating process. Conductive layer 172 is patterned and etched using photolithography to form sections which form a shielding layer above IPD 166 and IPD 168.

An encapsulation layer 174 is formed over conductive layer 172 and encapsulation 104. Encapsulation layer 174 provides additional environmental protection and electrical isolation for the underlying structures. In another embodiment, encapsulation layer 174 can be replaced by wafer level coating with spin, spray, or printing.

Singulated die 136 is mounted to carrier 180. Carrier 180 can be a PCB, semiconductor device, or another die. Solder bumps 176 form an electrical and structural connection between conductive layer 172 and bonding sites 178 on carrier 180. Stacks of conductive material are formed by vertically aligning conductive layer 94, conductive layer 100, vias 170, and conductive layer 172. The conductive layer 172 and the stacks of conductive material together form an embedded EMI shield cage structure to protect IPD 166 and IPD 168 from EMI.

In FIG. 9, IPD 190 and IPD 192 are formed on substrate 90. An insulation layer 92 is formed over substrate 90. Insulation layer 92 provides stress relief for subsequent layers and operates as an etch stop. Insulation layer 92 is typically SiO2, but can also be Si3N4, SiON, Ta2O5, ZrO2, Al2O3, or other material having insulating properties. The deposition of insulation layer 92 may involve PVD, CVD, printing and sintering, or thermal oxidation and result in a thickness ranging from 100-5000 Å.

A passivation layer 182 is deposited over insulation layer 92. Passivation layer 182 can be polyimide, BCB, PBO, SiO2, Si3N4, SiON, Ta2O5, Al2O3, or other suitable material having insulating properties. The deposition of passivation layer 182 may involve spin coating, PVD, CVD, printing and sintering, or thermal oxidation. Passivation layer 182 is patterned and etched using photolithography to created openings exposing insulation layer 92.

A conductive layer 94 is patterned and deposited over passivation layer 182 and insulation layer 92. Conductive layer 94 can be Al, Cu, Sn, Ni, Au, Ag, W, or other suitable electrically conductive material. Conductive layer 94 can have optional adhesion and barrier layers formed underneath or over the conductive layer. The adhesion and barrier layers can be Ti, TiW, TiN, Ta, or TaN. Conductive layer 94 can be deposited using PVD, CVD, electrolytic plating, or electroless plating process. Conductive layer 94 is patterned and etched using photolithography to form individual portions or sections. The individual portions of conductive layer 94 can be electrically common or electrically isolated depending on the connectivity of the individual semiconductor die formed on semiconductor wafer 90.

Passivation layer 96 is deposited and patterned over conductive layer 94 and passivation layer 182 using photolithography. Passivation layer 96 can be polyimide, BCB, PBO, SiO2, Si3N4, SiON, Ta2O5, Al2O3, or other suitable material having insulating properties. The deposition of passivation layer 96 may involve spin coating, PVD, CVD, printing and sintering, or thermal oxidation. After passivation layer 96 is deposited, it can be patterned using photolithography to form individual portions or sections. Conductive layer 100 is patterned and deposited over passivation layer 96 and conductive layer 94. Conductive layer 100 can be Al, Cu, Sn, Ni, Au, Ag, W, or other suitable electrically conductive material. Conductive layer 100 can have optional adhesion and barrier layers formed underneath or over the conductive layer. The adhesion and barrier layers can be Ti, TiW, TiN, Ta, or TaN. Conductive layer 100 can be deposited using PVD, CVD, electrolytic plating, or electroless plating process. Conductive layer 100 is patterned and etched using photolithography to form individual portions or sections. The individual portions of conductive layer 100 can be electrically common or electrically isolated depending on the connectivity of the individual semiconductor die formed on semiconductor wafer 90.

Encapsulation material 104 is deposited over conductive layer 100 and passivation layer 96. Encapsulation material 104 provides structural support, warpage control, and electrical isolation. Encapsulation material 104 may be any suitable insulating material such as molding compound, polyimide, BCB, PBO, or epoxy based insulating polymer. Encapsulation material 104 is patterned using photolithography to form a plurality of openings exposing conductive layer 100. Conductive and thermal vias 170 are formed by filling the openings with a conductive material. The vias can be Al, Cu, Sn, Ni, Ag, Au, W, or other suitable conductive material.

Conductive layer 172 is formed over the vias 170 and encapsulant 104. Conductive layer 172 can be Al, Cu, Sn, Ni, Au, Ag, W, or other suitable electrically conductive material. Conductive layer 172 can have optional adhesion and barrier layers formed underneath or over the conductive layer. The adhesion and barrier layers can be Ti, TiW, TiN, Ta, or TaN. Conductive layer 172 can be deposited using PVD, CVD, electrolytic plating, or electroless plating process. Conductive layer 172 is patterned and etched using photolithography to form sections which form a shielding layer above IPD 190 and IPD 192.

An encapsulation layer 174 is formed over conductive layer 172 and encapsulation 104. Encapsulation layer 174 provides additional environmental protection and electrical isolation for the underlying structures. In another embodiment, encapsulation layer 174 can be replaced by wafer level coating with spin, spray, or printing.

Singulated die 138 is mounted to carrier 181. Carrier 181 can be a PCB, semiconductor device, or another die. Solder bumps 176 form an electrical and structural connection between conductive layer 172 and bonding sites 178 on carrier 181. Stacks of conductive material are formed by vertically aligning conductive layer 94, conductive layer 100, vias 170, and conductive layer 172. The conductive layer 172 and the stacks of conductive material together form an embedded EMI shield cage to protect inductor 190 and inductor 192 from EMI. The formation of conductive layer 94 in the openings of passivation layer 182 creates an extended shielding cage for IPD 190.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a first substrate;
   forming a first conductive layer over the first substrate;
   forming an integrated passive device (IPD) over the first conductive layer;
   forming a first conductive pillar over a first portion of the first conductive layer;
   forming a second conductive pillar over a second portion of the first conductive layer separate from the first portion of the first conductive layer;
   forming a second conductive layer over the first conductive pillar to shield the IPD from electromagnetic interference (EMI), wherein the second conductive layer is electrically coupled to the first portion of the first conductive layer through the first conductive pillar and the IPD is electrically isolated from the first conductive pillar and first portion of the first conductive layer; and
   disposing a second substrate over the first substrate and electrically connected to the first conductive layer through the second conductive pillar.

2. The method of claim 1, wherein the second conductive pillar is electrically connected to the IPD and electrically isolated from the first conductive pillar.

3. The method of claim 1, further including an encapsulant disposed over the IPD and around the first conductive pillar.

4. The method of claim 1, further including vertically aligning and electrically connecting the first conductive pillar and second conductive layer to shield EMI.

5. The method of claim 1, further including forming the first conductive pillar to include copper.

6. A method of making a semiconductor device, comprising:
   providing a first substrate;
   forming a first conductive layer over the first substrate including a first portion of the first conductive layer coiled to exhibit inductive properties;
   forming a first conductive pillar over the first conductive layer;
   depositing an encapsulant over the first substrate after forming the first conductive layer and first conductive pillar, wherein the first conductive pillar extends to a surface of the encapsulant opposite the first substrate; and
   forming a second conductive layer over the first conductive pillar and directly on the surface of the encapsulant.

7. The method of claim 6, further including forming the first conductive pillar over a second portion of the first conductive layer electrically isolated from the first portion of the first conductive layer.

8. The method of claim 7, wherein the first conductive pillar is formed directly on the second portion of the first conductive layer and the second conductive layer is formed directly on the conductive pillar.

9. The method of claim 6, further including forming a second conductive pillar over a second portion of the first conductive layer and electrically connected to the first portion of the first conductive layer.

10. The method of claim 9, further including disposing a second substrate over the first substrate and electrically connected to the first portion of the first conductive layer through the second conductive pillar.

11. The method of claim 10, further including forming the second conductive layer on a surface of the second substrate.

12. The method of claim 6, further including forming the first conductive pillar from copper.

13. A method of making a semiconductor device, comprising:
   providing a first substrate;
   forming a first conductive layer over the substrate;
   forming an integrated passive device (IPD) over the first substrate, wherein the IPD includes a portion of the first conductive layer;
   forming a first conductive pillar over the first conductive layer and electrically isolated from the IPD;
   forming a second conductive pillar over the first conductive layer and electrically connected to the IPD, wherein the second conductive pillar is electrically isolated from the first conductive pillar;
   depositing an encapsulant over the first substrate and around the first conductive pillar;
   forming a second conductive layer on the encapsulant over the first conductive pillar and IPD, wherein the first conductive pillar and second conductive layer comprise an electromagnetic interference (EMI) shielding cage;
   providing a second substrate including a first solder bump and second solder bump disposed over the second substrate; and
   disposing the second substrate over the encapsulant with the first solder bump electrically coupled between the second substrate and the first conductive pillar and the second solder bump electrically coupled between the second substrate and the second conductive pillar.

14. The method of claim 13, further including forming the first conductive pillar and second conductive pillar directly on the first conductive layer.

15. The method of claim 13, further including disposing a second substrate over the first substrate and electrically connected to the second conductive pillar.

16. The method of claim 13, further including forming the first conductive pillar from copper.

17. The method of claim 13, further including forming a passivation layer over the encapsulant and second conductive layer.

18. A semiconductor device, comprising:
- a first substrate;
- a first conductive layer formed over the first substrate;
- an integrated passive device (IPD) formed to include a portion of the first conductive layer;
- a first conductive pillar formed over the first conductive layer and electrically isolated from the IPD;
- a second conductive pillar formed over the first conductive layer and electrically connected to the IPD;
- an encapsulant deposited over the first conductive layer, first conductive pillar, and second conductive pillar, wherein the encapsulant is in direct physical contact with the first conductive layer; and
- a second conductive layer formed directly on the encapsulant over the first conductive pillar, wherein the first conductive pillar and second conductive layer comprise an electromagnetic interference (EMI) shielding cage.

19. The semiconductor device of claim 18, further including a passivation layer formed over the second conductive layer.

20. The semiconductor device of claim 18, wherein the first conductive pillar includes copper.

21. The semiconductor device of claim 18, wherein the encapsulant is in direct physical contact with the first conductive pillar, second conductive pillar, and second conductive layer.

\* \* \* \* \*